(12) United States Patent
Shibata et al.

(10) Patent No.: US 8,638,156 B2
(45) Date of Patent: Jan. 28, 2014

(54) MULTI-OUTPUT-RESISTANCE SWITCH DRIVER CIRCUITS

(75) Inventors: Hajime Shibata, Toronto (CA); Wenhua Yang, North Andover, MA (US); David Alldred, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 63 days.

(21) Appl. No.: 13/204,505

(22) Filed: Aug. 5, 2011

(65) Prior Publication Data

US 2013/0033291 A1 Feb. 7, 2013

(51) Int. Cl.
*H03K 5/00* (2006.01)
*H03L 5/00* (2006.01)

(52) U.S. Cl.
USPC .......................... 327/308; 327/552; 338/81 R

(58) Field of Classification Search
USPC .............. 327/552–559, 308, 333; 333/81 R
See application file for complete search history.

(56) References Cited

U.S. PATENT DOCUMENTS

| | | | |
|---|---|---|---|
| 5,945,872 A | 8/1999 | Robertson et al. | |
| 6,118,326 A | 9/2000 | Singer et al. | |
| 7,479,829 B2 * | 1/2009 | Inoue | 330/251 |
| 7,679,447 B2 * | 3/2010 | Oishi | 330/284 |
| 7,760,003 B2 * | 7/2010 | Wu et al. | 327/307 |

OTHER PUBLICATIONS

M. E. Van Valkenburg, Analog Filter Design, Chapters 2-5, pp. 15-155, CBS College Publishing, 1982.

* cited by examiner

*Primary Examiner* — Dinh T. Le
(74) *Attorney, Agent, or Firm* — Kenyon & Kenyon, LLP

(57) ABSTRACT

A switch circuit can include an impedance selection switch and a multi-output-resistance switch driver. The impedance selection switch can electrically connect an impedance to an input of an amplifier in response to a driver output signal, and include at least one transistor. The multi-output-impedance switch driver may provide the driver output signal to the switch, and have a first, relatively higher output resistance when providing a first logic state of the driver output signal to turn on the switch, and a second, relatively lower output resistance when providing a second logic state of the driver output signal to turn off the switch. The ratio of the first output resistance to the second output resistance can be greater than a selected predetermined ratio value.

23 Claims, 10 Drawing Sheets

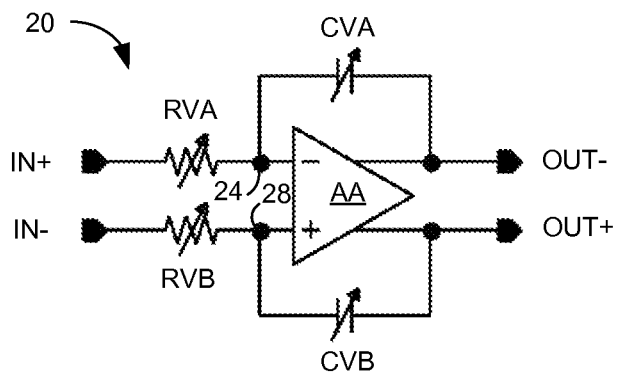
FIG. 1
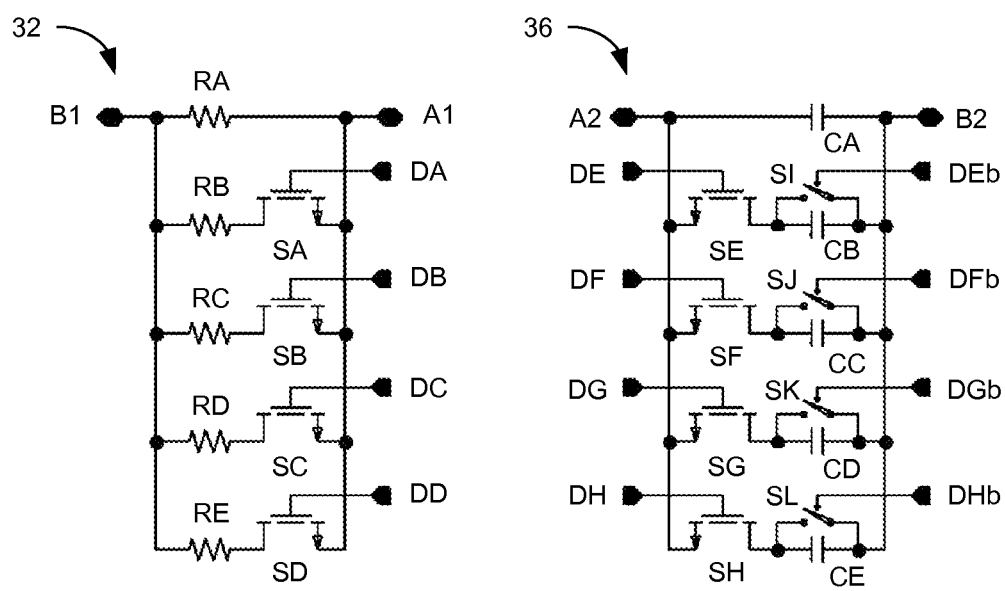
FIG. 2A　　　　　　　FIG. 2B

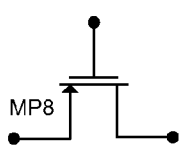
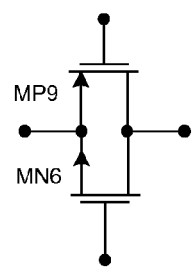
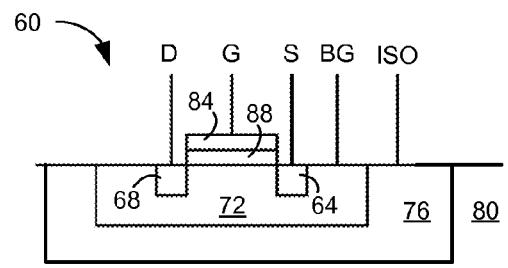
FIG. 9A     FIG. 9B     FIG. 11
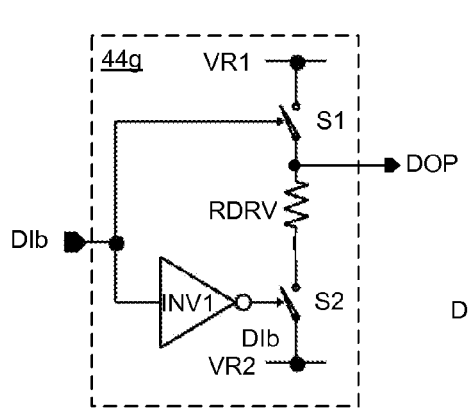 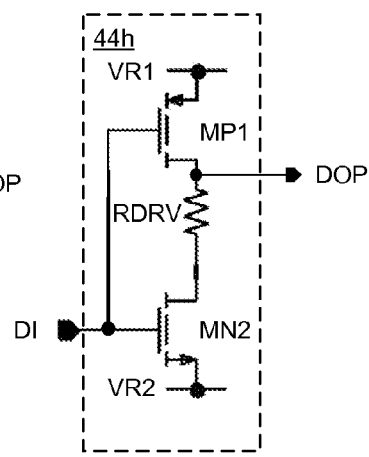
FIG. 10A     FIG. 10B
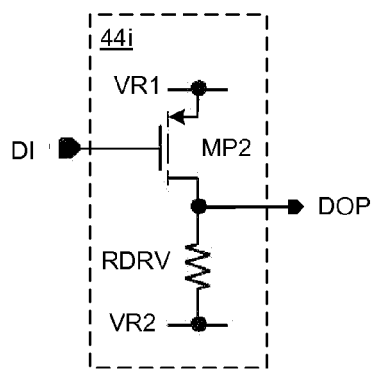 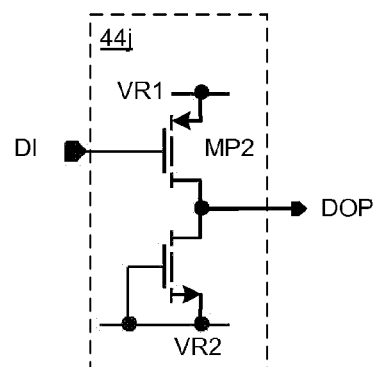
FIG. 10C     FIG. 10D

MULTI-OUTPUT-RESISTANCE SWITCH DRIVER CIRCUITS

BACKGROUND

Active-RC circuit configurations can include combinations of resistors, capacitors, and operational amplifiers arranged variously to implement continuous time filters and other circuits. FIG. 1 depicts an embodiment of an active-RC continuous-time filter 20. The filter 20 includes a differential amplifier AA, a pair of adjustable resistances RVA, RVB, and a pair of adjustable capacitances CVA, CVB arranged in a differential integrator configuration. The values to which the adjustable resistances RVA, RVB and capacitances CVA, CVB are set can dictate the frequency response of the filter, and thus its suitability for various applications.

FIGS. 2A and 2B depict exemplary embodiments 32, 36 of an adjustable resistance and capacitance, respectively. In FIG. 2A, a plurality of switches SA-SD selectively connect a plurality of resistors RB-RE in parallel with a first resistor RA as a function of a plurality of control signals DA-DD. Turning on selected combinations of the switches SA-SD can decrease the adjustable resistance value from a value equal to that of the first resistance RA, with no additional resistances selected, to a value equal to the parallel combination of all of the resistors RA-RE, with all of the additional resistors selected, or to intermediate values. In FIG. 2B, a plurality of switches SE-SH selectively connect a plurality of capacitors CB-CE in parallel with a first capacitor CA. Turning on selected combinations of the switches SE-SH using a plurality of control signals DE-DH can increase the adjustable capacitance value from a value equal to that of the first capacitor CA, with no additional capacitances selected, to a value equal to the sum of that of all of the capacitors CA-CE, with all of the additional capacitors selected, or to intermediate values. The architecture of FIG. 2B also includes a second plurality of switches SI-SL, driven by inverts DEb-DHb of the plurality of control signals DE-DH, to control the voltage at the floating nodes of the capacitors CB-CE when they are not selected.

When substituting the adjustable resistance and capacitance architectures of FIGS. 2A and 2B into the active-RC integrator 20 of FIG. 1, the node connecting the plurality of impedance selection switches SA-SD, SE-SH, i.e., node A1 in FIG. 2A and node A2 in FIG. 2B, can be connected to summing nodes 24, 28 of the active RC circuit 20, i.e., to the inputs of the operational amplifier AA. This may reduce the signal dependence of the adjustable resistance or capacitance values if the voltage variation at these summing nodes 24, 28 is less than that at the input IN+, IN− or output OUT+, OUT− of the integrator circuit 20, as often may be the case.

However, even if the impedance selection switches SA-SD, SE-SH are connected to the summing nodes 24, 28 of the operational amplifier AA, the adjustable resistance and capacitance architectures of FIGS. 2A and 2B can still suffer from signal-dependent resistance values and output signal distortion. In both FIGS. 2A and 2B, internal nodes of the parallel selectable resistor or capacitor branches, not connected to the summing nodes 24, 28, may still experience signal variations as a function of the on-resistances of the switches SA-SD, SE-SH. These signal-dependent voltages appearing across the switches SA-SD, SE-SH may in turn affect their on-resistance values, and thus the overall adjustable resistance or capacitance values, as a function of the input signal IN+-IN−.

One solution to this problem can include making the on-resistance of the switches SA-SD, SE-SH smaller by making the switches SA-SD, SE-SH wider, thus lessening the voltage division across the switches and the resulting the signal dependence of the adjustable resistance and capacitance values and output signal distortion. However, wider switches can entail greater parasitic capacitances, which can add capacitance to the summing nodes 24, 28 of the integrator 20 of FIG. 1. This can potentially divide the feedback signal delivered to the inputs of the amplifier AA and reduce the feedback factor $\beta$ by a factor equal to $CV/(CV+CP)$, where CP is the added parasitic capacitance and CV is the nominal feedback capacitance (e.g., CVA, CVB). This reduction in feedback factor may reduce the frequency response, distortion and stability performance of the integrator 20.

Thus, a need exists for switch circuits and switch drivers, for use in active-RC and other circuit configurations, that can be used to provide adjustable impedance values in response to control signals, while exhibiting reduced impedance signal-dependence and reduced circuit performance degradation with respect to frequency response, distortion and stability.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 1 is a circuit schematic depicting an embodiment of an active-RC circuit having tunable impedances.

FIGS. 2A-2B are circuit schematics depicting embodiments of a tunable resistance and a tunable capacitance, respectively, having a plurality of switches.

FIGS. 9A-9B are a circuit schematics depicting embodiment of switches of a switch circuit.

FIG. 10A-10D are circuit schematics depicting embodiments of the multi-output-resistance switch driver that can drive PMOS switch transistors.

FIG. 11 is a cross-sectional diagram depicting an embodiment of a transistor physical structure.

DETAILED DESCRIPTION

A switch circuit can include an impedance selection switch and a multi-output-resistance switch driver. The impedance selection switch can electrically connect an impedance to an input of an amplifier in response to a driver output signal, and include at least one transistor. The multi-output-resistance switch driver can provide the driver output signal to the switch, and can have a first, relatively higher output resistance when providing a first logic state of the driver output signal to turn on the switch, and a second, relatively lower output resistance when providing a second logic state of the driver output signal to turn off the switch.

The relatively higher output resistance presented by the switch driver while turning on the switch can reduce the performance degradation caused by the parasitic capacitances of the switch. The higher on-state output resistance can effectively remove or reduce the impact caused by gate-to-source and gate-to-drain parasitic capacitances of the switch transistor by lowering the frequency of their impact to much below the unity-gain frequency of an operational amplifier of the switch circuit. The relatively lower resistance presented by the switch driver while turning off the switch can reduce the degradation in switch circuit performance that might be caused by a higher off-state resistance. The lower off-state output resistance can effectively remove or reduce the impact of gate-to-drain and gate-to-source parasitic capacitances of the switch transistor at higher frequencies and reduce the leakage current that might flow through these parasitic capacitances in the off-state.

Figure 3:
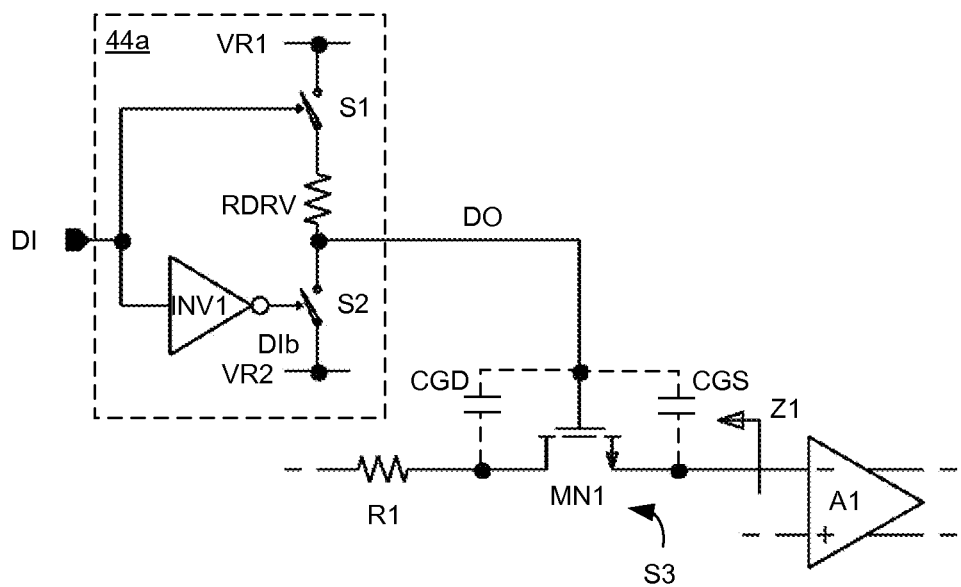
FIG. 3 is a circuit schematic depicting embodiments of a multi-output-resistance switch driver and a switch circuit, the multi-output-resistance switch driver driving an NMOS switch transistor.

FIG. 3 depicts a switch circuit 40a (switch circuit embodiments 40a-40o discussed herein can also be collectively referred as the switch circuit 40) including an embodiment of the multi-output-resistance switch driver 44a (switch driver embodiments 44a-44o discussed herein can also be collectively referred as the switch driver 44) for driving an impedance selection switch S3. The switch driver 44 can include first and second switches S1, S2, a driver resistance RDRV, an input to receive a switch driver input signal DI and an output to provide a switch driver output signal DO. The first switch S1 can connect a first terminal of the driver resistance RDRV to a first reference voltage VR1, and the second switch S2 can connect a second terminal of the driver resistance RDRV to a second reference voltage VR2. The driver output signal DO can be taken from the connection point of the second switch S2 to the driver resistance RDRV. The first and second reference voltages VR1, VR2 can be upper and lower power supply voltages, respectively, or any other reference voltage that can be used to drive a control terminal of the switch S3. As depicted in FIG. 3, the first and second switches S1, S2 can receive the switch driver input DI and its inverse DIb to control their enabling and disabling. The inverse DIb of the driver input DI can be generated using an inverter INV1.

The switch circuit 40 can be an active-RC circuit or any other circuit configuration containing an impedance-selecting switch. The switch circuit 40 can include components according to the active-RC architecture of FIGS. 1 and 2A-2B, including the switch S3, an operational amplifier A1 having an input connected to one of the pass-through terminals of the switch S3, and a resistor R1 connected to the other of the pass-through terminals of the switch S3. For simplicity, FIG. 3 does not depict the remaining components of the active-RC architecture of FIGS. 1 and 2A-2B, the presence of which can instead be indicated by the dashed lines emanating from the operational amplifier A1 and resistor R1. The switch circuit 40 can include one or more switch drivers 44 driving one or more switches configured similarly to the switch S3 depicted in FIG. 3 to select one or more resistors, one or more switch drivers 44 driving one or more switches configured to select one or more capacitances as depicted in FIG. 2B, or various combinations thereof. The switch S3 can be implemented by a single NMOS transistor MN1, having a gate configured as a switch control terminal and a source and a drain connected as pass-through terminals. The NMOS transistor MN1 can include inherent parasitic capacitances such as a gate-to-drain capacitance, illustrated as gate-to-drain capacitance CGD, appearing between the gate and drain of the NMOS transistor MN1 and a gate-to-source capacitance, illustrated as gate-to-source capacitance CGS, appearing between the gate and source of the transistor MN1. These parasitic capacitances CGS, CGD can be inherently part of the switch transistor MN1, although for explanation purposes they are illustrated as separate components in FIG. 3.

In operation, the switch driver 44 can receive the driver input DI and generate a corresponding driver output DO to controllably enable and disable the switch S3 of the switch circuit 40. In FIG. 3, the first and second switches S1, S2 can be activated according to predetermined logic levels of the driver input signal DI. To enable, or turn on, the switch S1 of the switch circuit 40, a first logic level of the driver input DI can turn on the first switch S1 of the switch driver 44. The inverse of the first logic level can be contemporaneously provided to the second switch S2 of the switch driver 44 through the inverter INV1, to disable, or turn off, the second switch S2. This can electrically connect the control terminal of the switch S3 to the first reference voltage VR1 through the driver resistance RDRV, delivering a voltage to the control terminal sufficient to turn on the switch S3, while presenting a first output resistance of the switch driver 44 having a value modeled by the driver resistance RDRV connected between the control terminal of the switch S3 and the first reference voltage VR1, which can act as an AC ground, by the first switch S1. The first output resistance of the switch driver 44 can have a value substantially equal to the value of the driver resistance RDRV and the on-resistance of the first switch S1 connected in series between the output of the switch driver 44 and the first reference voltage VR1. Often, the driver resistance RDRV may be substantially larger than the on-resistance of the first switch S1, and thus the first output resistance of the switch driver 44 can have a value substantially equal to the value of the driver resistance RDRV connected between the output of the switch driver 44 and the first reference voltage VR1.

The specific value of the driver resistance RDRV can be selected to provide beneficial performance improvements to the switch circuit 40. The relatively higher first output resistance presented by the switch driver 44 while turning on the switch S3 can remove or reduce the degradation caused by the parasitic capacitances CGS, CGD of the switch S3 to the performance of the switch circuit 40 when the switch is turned on by lowering the frequency of their impact to below the unity-gain frequency of the operational amplifier A1 of the switch circuit 40. The AC resistance presented to the negative input terminal of the operational amplifier A1 in FIG. 3, when the switch S3 is turned on, can be modeled as the parallel combination of the parasitic gate-to-drain and gate-to-source capacitances CGD, CGS in series with the driver resistance, or $Z1=RDRV+1/(s\ CGD+s\ CGS)$. This can create a corner frequency for the switch circuit 40 having a value modeled by $1/(2\pi RDRV\ (CGD+CGS))$. The driver resistance value can be selected to beneficially place this corner frequency relative to the unity gain frequency of the operational amplifier A1, thereby improving the frequency response and stability performance of the switch circuit 40. The unity gain frequency of the operational amplifier A1 can be defined as the frequency at which the open-loop gain of the operational amplifier has a value equal to one (1). The driver resistance RDRV can be selected to have a relatively high value to improve the frequency response and stability performance of the switch circuit. In one embodiment, the value of the driver resistance RDRV can be selected to provide this corner frequency with a value lower than the unity gain frequency of the operational amplifier A1. In a specific example, the value of the driver resistance RDRV can be selected to provide this corner frequency with a value less than half the unity gain frequency of the operational amplifier A1. In other embodiments, the value of the driver resistance RDRV can be selected to provide this corner frequency with a value much lower than the unity gain frequency of the operational amplifier A1. In one specific example, the value of driver resistance RDRV can be selected to provide this corner frequency with a value less than one-fourth the unity gain frequency of the operational amplifier A1. In another specific example, the value of driver resistance RDRV can be selected to provide this corner frequency with a value less than one-hundredth the unity gain frequency of the operational amplifier A1.

This first output resistance of the switch driver 44 is different than would be an output resistance corresponding to a circuit similar to that depicted in FIG. 3, but with the driver resistance RDRV replaced by a short. In such a circuit, the driver would always present a zero or very low resistance value connected between the driver output and corresponding reference voltages connected to the driver switches. Such a circuit would not have a first output resistance value selectable to control the placement in frequency of the circuit performance impact of parasitic capacitances of a transistor of the switch of the switch circuit appearing at the input of the operational amplifier.

To disable, or turn off, the switch S3 of the switch circuit 40, a second logic level of the driver input DI can turn off the first switch S1 of the switch driver 44. The inverse of the second logic level can be contemporaneously provided to the second switch S2 of the switch driver 44 through the inverter INV1, to enable, or turn on, the second switch S2. This can electrically connect the control terminal of the switch S3 of the switch circuit 40 directly to the second reference voltage VR2, delivering a voltage to the control terminal sufficient to turn off the switch S3, while presenting a second output resistance of the switch driver 44. The second output resistance can take the form of the on-resistance of the second switch S2 connected between the control terminal and the second reference voltage VR2, which can act as an AC ground.

The second output resistance of the switch driver 44 can be equal to the on-resistance of the second switch S2, and thus can have a relatively lower value in comparison to the first output resistance of the switch driver 44. The specific value of the second output resistance can be selected by selecting the on-resistance of the second switch S2 of the switch driver 44. Different performance concerns regarding the switch circuit 40 may exist when the switch driver 44 is turning off the switch S3 in comparison to when the switch driver 44 is turning on the switch S3, and thus it may be desirable to selected the second output resistance to have a different value than the first output resistance. Using a relatively higher switch driver output resistance when turning off the switch may undesirably impact the performance of the switch circuit 40. If the second output resistance has an impedance magnitude greater than that of the gate-to-drain and gate-to-source parasitic capacitances CGD, CGS of the switch transistor MN1, leakage current may flow through the gate-to-drain and gate-to-source capacitances CGD, CGS from the drain to the source of this transistor MN1. When the switch is turned off, such leakage current can result in inaccuracy of the selected adjustable resistance value of the switch circuit. A relatively lower value of the second resistance can prevent or reduce this leakage current and thereby improve the performance of the switch circuit 44 by improving the accuracy of the adjustable resistance or capacitance.

The second output resistance can optionally have an impedance magnitude, i.e., resistance value, selected to be less than the impedance magnitudes ZGD, ZGS of the gate-to-drain and gate-to-source parasitic capacitances CGD, CGS of the switch transistor MN1, as given by the formulas $ZGD=1/(2\pi f\ CGD)$ and $ZGS=1/(2\pi f\ CGS)$, where f is a selected frequency of operational interest such as, e.g., the unity gain frequency of the operational amplifier A1. For example, the value of the second output resistance can be selected to be less than half the impedance magnitudes of the gate-to-drain and gate-to-source parasitic capacitances CGD, CGS at the unity gain frequency of the operational amplifier A1. In other embodiments, the value of the second output resistance can be selected to be much less than the impedance magnitudes of the gate-to-drain and gate-to-source parasitic capacitances CGD, CGS at the unity gain frequency of the operational amplifier A1. In one specific example, the value of the second output resistance can be selected to be less than one-hundredth the impedance magnitudes of the gate-to-drain and gate-to-source parasitic capacitances CGD, CGS at the unity gain frequency of the operational amplifier A1. In another specific example, the value of the second output resistance can be selected to be less than one-thousandth the impedance magnitudes of the gate-to-drain and gate-to-source parasitic capacitances CGD, CGS at the unity gain frequency of the operational amplifier A1.

The relatively lower off-state resistance presented by the switch driver 44 to the switch S3 of the switch circuit 40 can reduce the degradation in switch circuit performance that might be caused by a relatively higher off-state resistance by effectively removing or reducing the impact of the gate-to-drain parasitic capacitance CGD of the switch transistor MN1 at higher frequencies to reduce the leakage current that might flow through this parasitic capacitance CGD in the off-state. This switch circuit performance improvement may also not unduly negatively impact the overall frequency response of the switch circuit 40 when the switch S3 is turned off. With the switch S3 turned off, and assuming a zero-value second output resistance of the switch driver circuit 44, only the gate-to-source parasitic capacitance CGS of the switch transistor MN1 may be presented to the negative input terminal of the operational amplifier by the switch S3 and switch driver 44. This gate-to-source capacitance CGS may be relatively smaller when the switch transistor MN1 is turned off, as an accumulation channel does not exist in the transistor MN1 when it is turned off.

The values of the first and second output resistances of the switch driver 44 can be selected according to the considerations discussed above by selecting a predetermined ratio of the value of the first output resistance to the value of the second output resistance. That is, the performance benefits of the relatively higher first output resistance and relatively lower second output resistance of the switch driver 44 can be ensured by a sufficiently high ratio of the first output resistance to the second output resistance. To achieve these performance benefits, this ratio can be selected to be, in one embodiment, at least greater than about 4:1, and, in other embodiments, much greater than about 4:1, for example, greater than about 10:1 in one embodiment, and greater than about 50:1 in another embodiment.

Such exemplary selected values of the ratio of the first output resistance to the second output resistance of the switch driver 44 are different than would result for a ratio of on to off output resistances for a circuit similar to that depicted in FIG. 3, but with the driver resistance RDRV replaced by a short. In such a circuit, the driver would typically present a 1:1 ratio of on to off output resistances, e.g., to achieve equal on and off time constants, or a ratio dictated by identical NMOS and PMOS transistor sizes that may typically be used to implement the switches of such a circuit, to achieve a minimum size circuit. By contrast, the exemplary selected values of the predetermined ratio of the first to second output resistances of the switch driver 44 discussed above reflect the increased performance benefits resulting from the relatively higher first output resistance and relatively lower second output resistance of the switch driver 44. Such selected predetermined ratio values would be counter-intuitive to a circuit designer focused on either equal on and off time constants or minimum circuit size.

The first and second output resistance values of the switch driver 44 can be selected by individually selecting the first and second output resistance values directly according to various principles discussed above, by selecting the first and second resistance values according to a selected predetermined ratio representing and encapsulating the benefits of the various principles discussed above, or by a combination of both. For example, the first output resistance value may first be selected to have a value sufficiently high to give a corner frequency of the switch circuit 40, having a value modeled by $1/(2\pi RDRV (CGD+CGS))$, a value much lower than the unity gain frequency of the operational amplifier A1, such as, e.g., a value less than one-fourth the unity gain frequency of the operational amplifier A1, or a value less than one-hundredth the unity gain frequency of the operational amplifier A1. The second output resistance value may then be selected by selecting the predetermined ratio of the first output resistance to the second output resistance, and then setting the second output resistance according the selected first output resistance and predetermined ratio. In such an example, the predetermined ratio of the first output resistance to the second output resistance can be selected so that, e.g., as either directly calculated or empirically verified, the second output resistance can have a value much less than the impedance magnitudes of the gate-to-drain and gate-to-source parasitic capacitances CGD, CGS of the switch transistor MN1 at the unity gain frequency of the operational amplifier A1, such as, e.g., a value less than one-hundredth the impedance magnitudes of the gate-to-drain and gate-to-source parasitic capacitances CGD, CGS of the switch transistor MN1 at the unity gain frequency of the operational amplifier A1, or a value less than one-thousandth the impedance magnitudes of the gate-to-drain and gate-to-source parasitic capacitances CGD, CGS of the switch transistor MN1 at the unity gain frequency of the operational amplifier A1.

Alternatively, the second output resistance may first be selected to have a value selected to be much less than the impedance magnitudes of the gate-to-drain and gate-to-source parasitic capacitances CGD, CGS of the switch transistor MN1 at the unity gain frequency of the operational amplifier A1, such as, e.g., a value less than one-hundredth the impedance magnitudes of the gate-to-drain and gate-to-source parasitic capacitances CGD, CGS of the switch transistor MN1 at the unity gain frequency of the operational amplifier A1, or a value less than one-thousandth the impedance magnitudes of the gate-to-drain and gate-to-source parasitic capacitances CGD, CGS of the switch transistor MN1 at the unity gain frequency of the operational amplifier A1. The first output resistance may then be selected by selecting the predetermined ratio of the first output resistance to the second output resistance, and then setting the first output resistance according the selected second output resistance and predetermined ratio. In such an embodiment, the predetermined ratio of the first output resistance to the second output resistance may be selected so that, e.g., as specifically calculated or empirically verified, the first output resistance has a value sufficiently high to give a corner frequency of the switch circuit 40, having a value modeled by $1/(2\pi RDRV (CGD+CGS))$, a value much lower than the unity gain frequency of the operational amplifier A1, such as, e.g., a value less than one-fourth the unity gain frequency of the operational amplifier A1, or a value less than one-hundredth the unity gain frequency of the operational amplifier A1.

Figure 4:
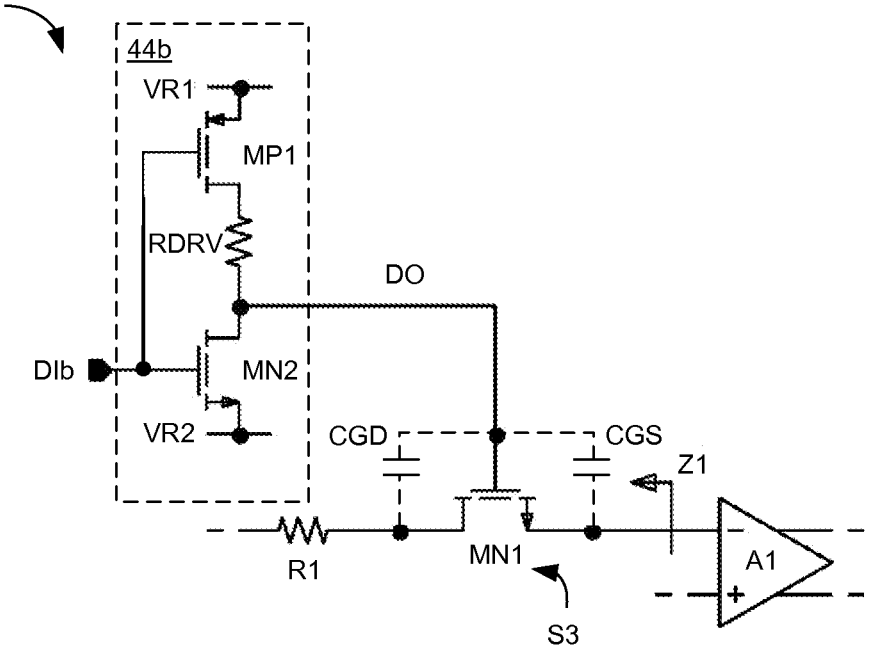
FIG. 4 is a circuit schematic depicting embodiments of the multi-output-resistance switch driver and the switch circuit.

The first and second switches S1, S2 of the switch driver 44 can be implemented using transistors. FIG. 4 depicts an embodiment of the switch circuit 40*b* having an embodiment of the switch driver 44*b* including exemplary implementations of the first and second switches S1, S2. In FIG. 4, the switch driver 44 can include a PMOS transistor MP1 implementing the first switch S1, an NMOS transistor MN2 implementing the second switch S2, and an explicit driver resistance RDRV. The PMOS transistor MP1 can include a gate connected to receive the switch driver input DIb, in this instance an inverse of the input depicted in FIG. 3, a source connected to the first reference voltage VR1, and a drain connected to the first terminal of the driver resistance RDRV. The NMOS transistor MN2 can include a gate also connected to receive the switch driver input DIb, a source connected to the second reference voltage VR2, and a drain connected to the second terminal of the driver resistance RDRV. The switch driver output DO can be taken from the node connecting the driver resistance RDRV to the drain of the NMOS transistor MN2. Note that because a PMOS transistor MP1 is used to implement the first switch S1, while an NMOS transistor MN2 is used to implement the second switch S2, an inherent inversion takes place in one of the PMOS or NMOS transistors MP1, MN2 relative to the other of the NMOS or PMOS transistors MN2, MP1, and thus there may be no need for an explicit inverter INV1, as shown in FIG. 3. In other words, in FIG. 4 the first and second switches S1, S2 have been implemented by types of transistors, respectively, that require opposite, or inverted, logic levels, respectively, to be enabled or disabled. In FIG. 4, the first output resistance of the switch driver 44, corresponding to driving the on state of the switch S3 of the switch circuit 40, can be selected by selecting the driver resistance value RDRV, as discussed above. The second output resistance of the switch driver 44, corresponding to driving the off state of the switch S3 of the switch circuit 40, can be selected by selecting the on-resistance of the NMOS transistor MN2 by selecting, e.g., the size of the NMOS transistor MN2, such as by selecting at least one of the width or length of the NMOS transistor MN2.

Figure 5:
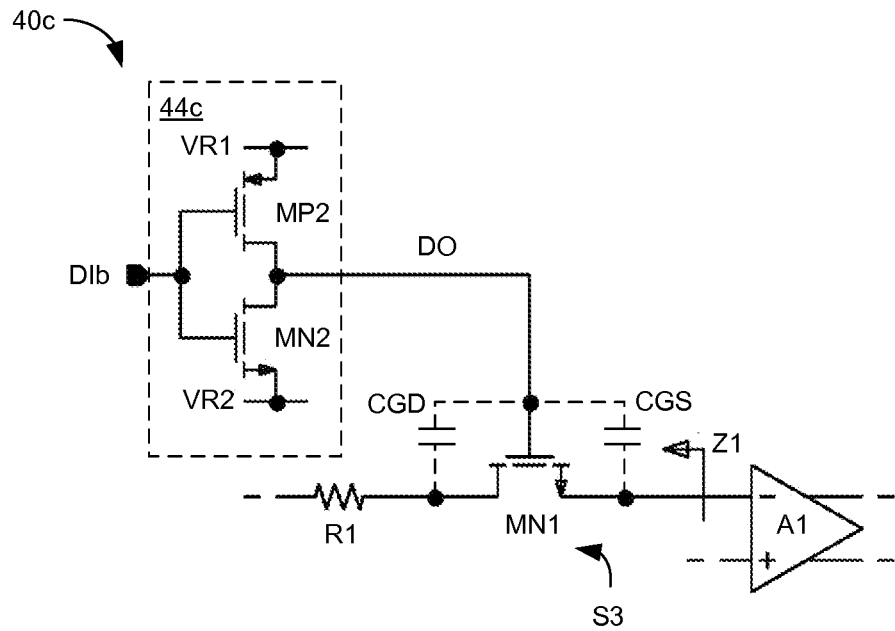
FIG. 5 is a circuit schematic depicting embodiments of the multi-output-resistance switch driver and the switch circuit.

The first output resistance of the switch driver 44, e.g., modeled by the driver resistance RDRV, can be implemented by an explicit resistor, e.g., as depicted in FIGS. 3 and 4, or by selecting implementation characteristics of the first switch S1 of the switch driver 44. FIG. 5 depicts an embodiment of the switch circuit 40c having an embodiment of the switch driver 44c in which the driver resistance RDRV can be implemented as the on-resistance of the first switch S1. In FIG. 5, the first switch S1 and driver resistance RDRV can both be implemented by a PMOS transistor MP2, with the switching characteristics of the PMOS transistor MP2 providing the first switch functionality and the on-resistance of the PMOS transistor MP2 providing the driver resistance functionality. The value of the driver resistance RDRV can be selected by selecting characteristics of the PMOS transistor MP2 to select the value of its on resistance. In one embodiment, the value of the first output resistance can be selected by selecting the size, e.g., by selecting the length, width or both, of the PMOS transistor MP2 to select the value it its on resistance. Also, as discussed above, the second output resistance of the switch driver 44 can be selected by selecting characteristics, e.g., the length, width or both, of the NMOS transistor MN2. Thus, in FIG. 5, both the first and second output resistances of the switch driver 44 can be selected by selecting characteristics such as the length and width of PMOS and NMOS transistors, respectively.

Figure 6:
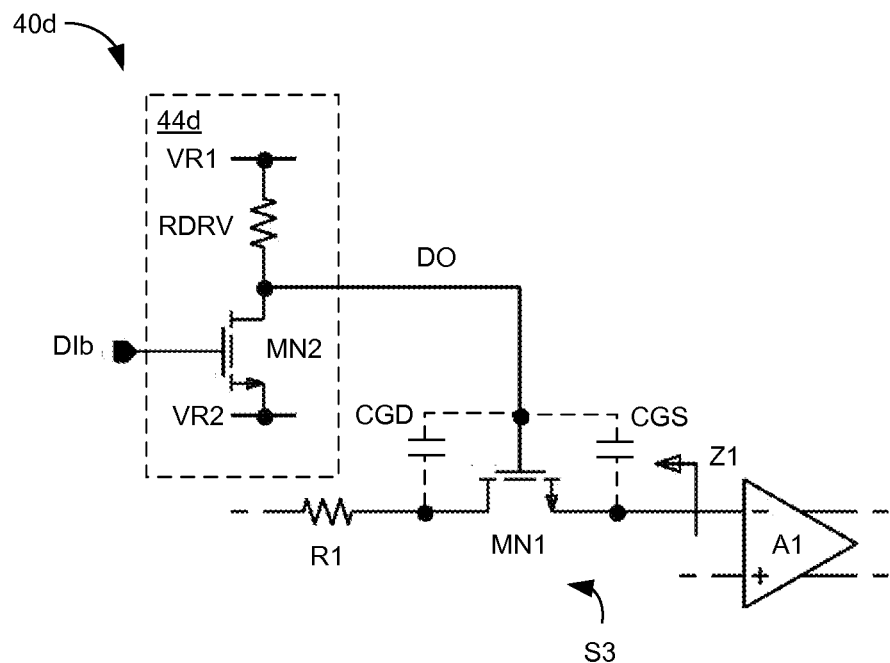
FIG. 6 is a circuit schematic depicting embodiments of the multi-output-resistance switch driver and the switch circuit.

The first switch S1 and driver resistance RDRV of the switch driver 44 can also effectively be implemented as part of a resistor implementation of the driver resistance RDRV. FIG. 6 depicts an embodiment of the switch circuit 40d having an embodiment of the switch driver 44d in which the first switch S1 and driver resistance RDRV can be implemented by the driver resistance RDRV connected from the driver output DO directly to the first reference voltage VR1. In operation, the driver input DIb can control enabling of the switch S3 of the switch circuit 40 by assuming a first logic state, e.g., a logic low state, that turns off the NMOS transistor MN2 implementing the second switch S2, and allows the driver resistance RDRV to connect the control terminal of the switch S3 to the first reference voltage VR3, effectively mimicking the effect of the first switch S1 being turned on if it were explicitly present. In this state, the switch driver 44 can presents the first output resistance represented by the driver resistance RDRV. The driver input DIb can also control disabling of the switch S3 of the switch circuit 40 by assuming a second logic state, e.g., a logic high state, that turns on the NMOS transistor MN2 implementing the second switch S2, connecting the control terminal of the switch S3 to the second reference voltage VR2. In this state, the switch driver 44 presents the second output resistance represented by the on-resistance of the NMOS transistor MN2 implementing the second switch S2, which can be selected by selecting characteristics, such as the width and length, of the NMOS transistor MN2.

Figure 7:
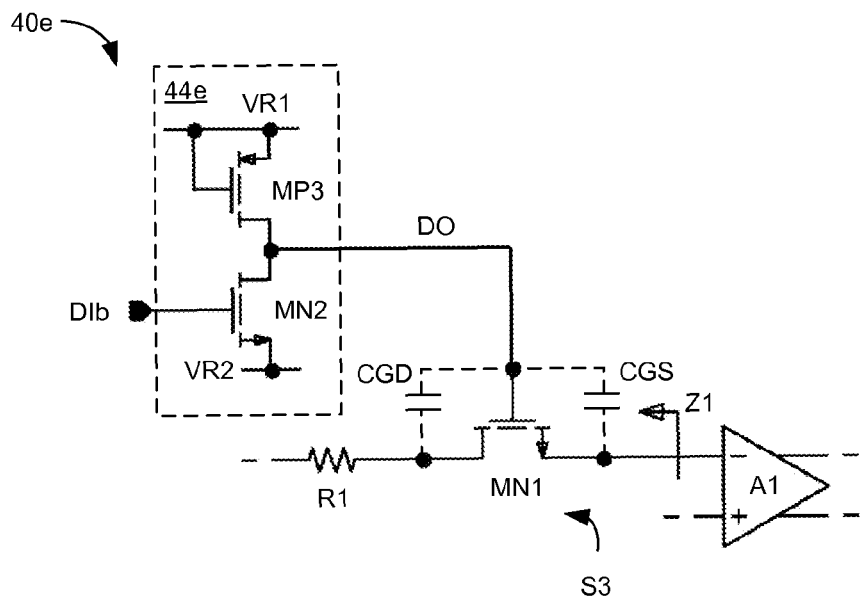
FIG. 7 is a circuit schematic depicting embodiments of the multi-output-resistance switch driver and the switch circuit.

The first switch S1 and driver resistance RDRV of the switch driver 44 can also be effectively implemented together as part of a MOSFET transistor connected into an off state, and thus producing only leakage current, by connecting its source and drain together. FIG. 7 depicts an embodiment of the switch circuit 40e having an embodiment of the switch driver 44e in which the first switch S1 and driver resistance RDRV of the switch driver 44 can be implemented by a PMOS transistor MP3 having its gate and source connected to the first reference voltage VR1 and its drain connected to the driver output DO. In operation, the driver input DIb can control enabling of the switch S3 of the switch circuit 40 by assuming a first logic state, e.g., a logic low state, that turns off the NMOS transistor MN2 implementing the second switch S2, and allows the PMOS transistor MP3 to connect the control terminal of the switch S3 to the first reference voltage VR1, effectively mimicking the effect of the first switch S1 being turned on if it were explicitly present. The characteristics of the off-connected PMOS transistor MP3, e.g., its size characteristics such as length and width, can be selected as a function of, or to have a predetermined relationship to, characteristics of the NMOS transistor MN2, e.g., its size characteristics such as length and width, so that in this first state, the leakage current of the off-connected PMOS transistor MP3 can be greater than the leakage current of the NMOS transistor MN2, so that the off-connected PMOS transistor MP3 can pull the driver output DO up to the first reference voltage VR1. In this state, the switch driver 44 can present the first output resistance having a value of the resistance presented by the off-connected PMOS transistor MP3, as seen looking into its source from the driver output DO. This first output resistance of the switch driver 44 can be selected by selecting the characteristics of the PMOS transistor MP3 such as its size characteristics, e.g., the width, length or both of the PMOS transistor MP3. The driver input DI can also control disabling of the switch S3 of the switch circuit 40 by assuming a second logic state, e.g., a logic high state, that turns on the NMOS transistor MN1 implementing the second switch S2, and connects the control terminal of the switch S3 to the second reference voltage VR2. In this state, the switch driver 44 can present the second output resistance represented by the on resistance of the NMOS transistor MN2 implementing the second switch, which can also be selected by selecting characteristics, such as the width, length or both, of the NMOS transistor MN2.

Figure 8:
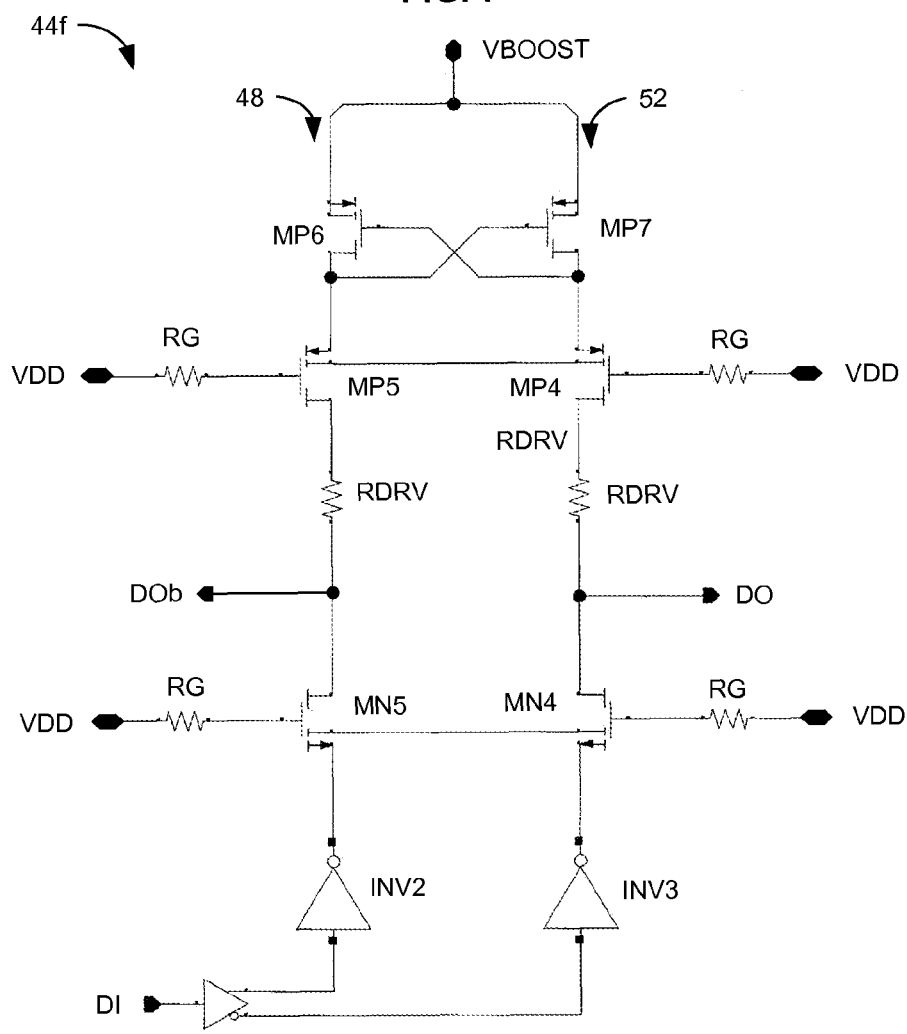
FIG. 8 is a circuit schematic depicting embodiments of the multi-output-resistance switch driver providing boosted and inverted driver outputs.

Embodiments of the switch driver 44 can also provide boosted and inverted driver outputs. FIG. 8 depicts an embodiment of the switch driver 44f, incorporating the first switch S1, second switch S2 and driver resistance RDRV depicted in FIG. 3, that can provide a boosted voltage driver output DO, and its inverse DOb, from a reduced voltage driver input DI. In FIG. 8, first and second switch driver branches 48, 52 each include the first switch S1, second switch S2 and driver resistance RDRV. In the left branch 48, the first switch S1 can be implemented by a common-gate configured NMOS transistor MN5, the driver resistance by an explicit driver resistance RDRV, and the second switch S2 by a common-gate configured PMOS transistor MP5. The NMOS transistor MN5 can be driven by a level converter A/INV and an inverter INV2, and the PMOS transistor MP5 can be driven by a PMOS transistor MP6 cross-connected to the right branch 52. Similarly, in the right branch 52, the first switch S1 can be implemented by a common-gate configured NMOS transistor MN4, the driver resistance by an explicit driver resistance RDRV, and the second switch S2 by a common-gate configured PMOS transistor MP4. The NMOS transistor MN4 can be driven by the inverter-and-level-converter A/INV and an inverter INV3, and the PMOS transistor MP4 can be driven by a PMOS transistor MP7 cross-connected to the left branch 48. The inverter-and-level-converter A/INV can accept a reduced-voltage driver input DI, e.g., varying between logic levels indicated by 0V and 1V, and convert these to a power supply logic level signals, e.g., at 0V and 2.5V, and the inverse. The common-gate transistors MN4, MN5, MP4, MP5 can receive power supply level voltages, e.g., 2.5V, at their gates. The cross-connected transistors MP6, MP7 can receive a boosted voltage VBOOST, e.g., 4V, at their sources. In operation, the boosted, differential switch driver embodiment can provide a boosted driver output DO, e.g., at logic levels indicated by 0V or 4V, and an inverse boosted driver output DOb, e.g., at logical levels inverted from, but also indicated by 0V and 4V.

As with the previously discussed embodiments, the boosted, inverted switch driver 44 can also provide a first, relatively higher output resistance in a state to turn on a switch receiving the driver output DO, and a second, relatively lower output resistance in a state to turn off a switch receiving the driver output DO. In FIG. 8, when providing a boosted, logic high driver output DO, the switch driver 44 can present a first output resistance having a value represented by the driver resistance RDRV, which value can be selected as discussed above to improve circuit performance. When providing a logic low driver output DO, the switch driver 44 can present a second output resistance having a value represented by the output resistance of the common-gate configured NMOS transistor MN4, MN5 in its on state, which can be selected to have a relatively low value by selecting characteristics of the common-gate NMOS transistor MN4, MN5, such its width and length.

Although the switch S3 of the switch circuit 40 can be implemented by a single transistor, e.g., by a single NMOS transistor MN1 as depicted in FIG. 3, in other embodiments the switch S3 of the switch circuit 40 can be implemented by a single PMOS transistor MP8 (an exemplary embodiment of which is depicted in FIG. 9A), a transfer-gate style structure having both an NMOS and a PMOS transistor MN6, MP9 (an exemplary embodiment of which is depicted in FIG. 9B), or any other switch implementation. NMOS transistors in switch embodiments can be driven using switch driver embodiments 44 configured as discussed above. PMOS transistors may require a driver output inverted relative to a drive signal for an NMOS transistor. Embodiments of the switch driver can also provide driver outputs to drive PMOS transistors. FIG. 10A depicts an embodiment of the switch driver 44g configured to provide a driver output DOP to drive PMOS transistors by taking the driver output DOP at the connection of the first switch S1 and the driver resistance RDRV instead of at the connection of the second switch S2 and the driver resistance RDRV. FIG. 10B depicts another embodiment of the switch driver 44h configured to provide a driver output DOP to drive PMOS transistors by taking the driver output DOP at the connection of the first switch transistor MP1 and the driver resistance RDRV. Other embodiments of the switch driver 44 discussed herein as providing driver outputs for NMOS switch transistors can also be instead configured to provide driver outputs for PMOS switch transistors similarly as depicted in FIGS. 10A and 10B relative to FIGS. 3 and 4. Some embodiments of the switch driver 44 can also be adapted to provide a driver output DOP suitable to drive PMOS switch transistors by providing complimentary embodiments in which the role of PMOS and NMOS transistors are correspondingly exchanged. For example, the switch driver embodiments 44d,e of FIGS. 6 and 7 can be adapted to provide a PMOS driver output DOP as depicted by the switch driver embodiments 44i,j of FIGS. 10C and 10D.

The switch driver 44 can also be used to drive the backgate of transistors implementing switches of switch circuits. FIG. 11 depicts an embodiment of a cross section of a transistor 60 that can be used to implement a switch in a switch circuit. The transistor 60 can includes source and drain regions 64, 68 formed in a body well 72, which can itself be formed in an isolation region 76 that isolates the body well 72 from other areas of the substrate. For example, the depicted cross section can represent an NMOS transistor with n-type semiconductor source and drain regions 64, 68 formed in p-type semiconductor well 72, which can be isolated from other areas of the substrate 80 by an n-type isolation region 76. The depicted cross section can also represent an PMOS transistor with p-type semiconductor source and drain regions 64, 68 formed in n-type semiconductor well 72, which can be isolated from other areas of the substrate 80 by an p-type isolation region 76. The transistor 60 can also include a gate 84 formed on a dielectric layer 88, which can be formed on the body region 72 between the source and drain regions 64, 68. The transistor 60 can include terminals D, S, G, BG, ISO contacting to the drain, source, gate, body, and isolation regions 64, 68, 84, 72, 76. The body 72 of the transistor 60 can be referred to as the backgate, and its terminal a backgate terminal BG. Selectively providing a voltage or signal to the backgate 72 can be advantageous to control performance characteristics of a switch implemented by the transistor 60 in a switch circuit. As discussed above, parasitic capacitances can be inherent to transistor structures, and can include, in addition to the previously identified gate-to-source and gate-to-drain capacitances CGS, CGD, a drain-to-body capacitance CDB appearing between the drain 68 and the body 72 (i.e., backgate), a source-to-body capacitance CSB appearing between the source 64 and body 72, and a body-to-isolation capacitance CBI appearing between the body 72 an the isolation region 76. In some embodiments, one or more switch transistors may share a body region 72, isolation region 76, or both.

Figure 12:
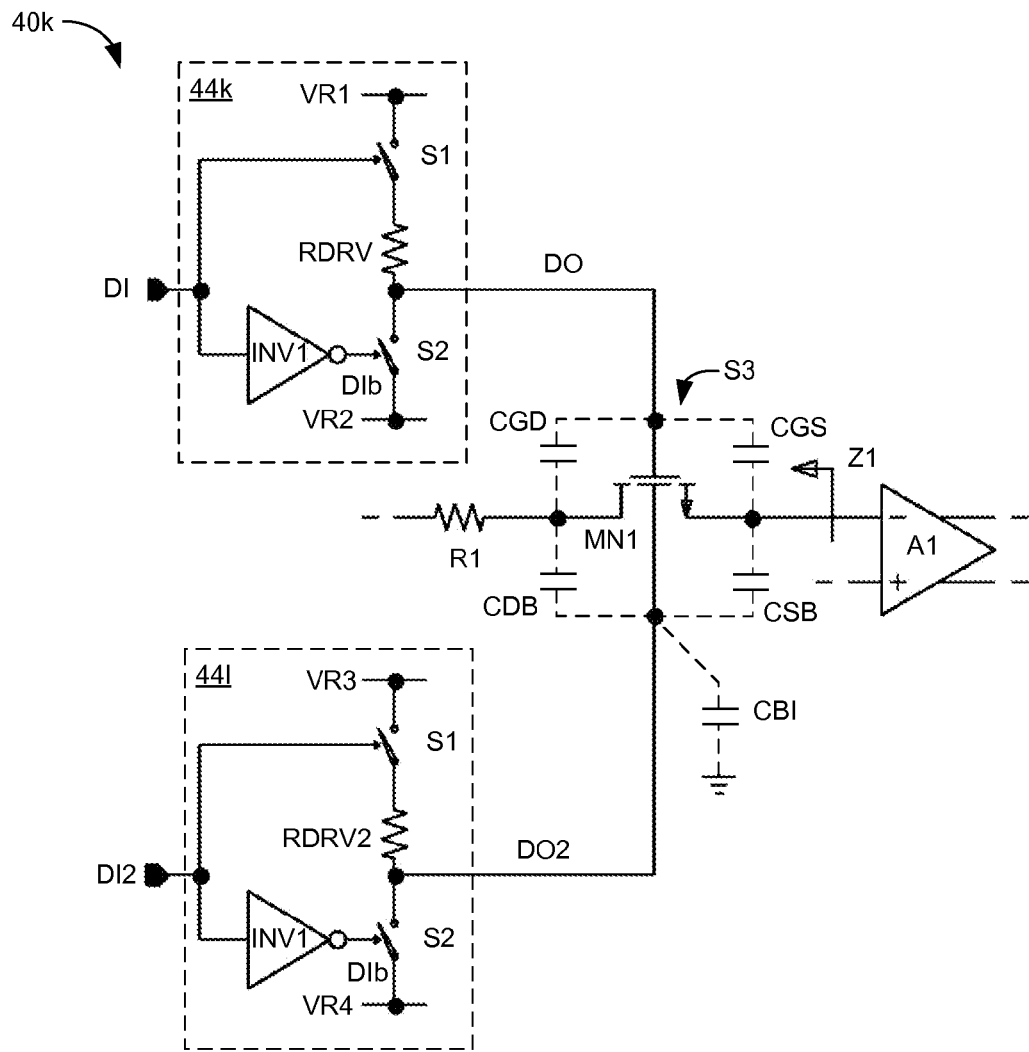
FIG. 12 is a circuit schematic depicting embodiments of the multi-output-resistance switch driver driving both a gate and a backgate of a switch transistor of the switch circuit.

FIG. 12 depicts an embodiment of the switch circuit 40k having a plurality of multi-output-resistance switch drivers 44k,l that can drive both a gate and a backgate of the switch S3 of the switch circuit 40. In FIG. 12, a first switch driver 44k can drive a gate of the transistor MN1 implementing the switch S3, providing first and second output resistances during on and off states of the switch S3, respectively, to remove or reduce the deleterious effects of gate-to-drain and gate-to-source parasitic capacitances CGD, CGS of the transistor MN1 implementing the switch S3. A second switch driver 44l can drive a backgate of the transistor MN1 implementing the switch S3, providing its own first and second output resistances during on and off states of the switch S3, respectively, to remove or reduce the deleterious effects of the drain-to-body, source-to-body, and body-to-isolation parasitic capacitances CDB, CSB, CBI of the transistor MN1 implementing the switch S3. In operation, the second switch driver 44 can drive the backgate to a third reference voltage VR3, through a driver resistance RDRV2, in the on state of the switch S3, and to a fourth reference voltage VR4 in the off state of the switch S3.

The third and fourth reference voltages VR3, VR4 can be different than the first and second reference voltages VR1, VR2. While the first and second reference voltages VR1, VR2 of the first switch driver 44a can represent different logic states, e.g., logic high and low states, and be different voltages, e.g., high and low power supply voltages, the third and fourth reference voltages VR3, VR4 may represent the same logic state, e.g., a logic low state, and may be the same voltage, e.g., a low power supply voltage. In another embodiment, the third and fourth reference voltages VR3, VR4 of the second switch driver 44 can be different voltages. For example, the third reference voltage VR3 may represent a logic low state, and be, e.g., a low power supply voltage, while the fourth reference voltage VR4 may not represent a logic state, and instead be an intermediate voltage between the high and low power supply voltages. The intermediate voltage can be selected to be the same as or approximate the voltage value of the summing node, i.e., the operational amplifier input node, to which the switch S3 is connected. In one embodiment, the intermediate voltage can be selected to be halfway between the upper and lower power supply voltages.

Regardless of whether the third and fourth reference voltages VR3, VR4 are the same or different, however, the second driver circuit 44 can still present different first and second output resistances to the backgate of the transistor MN3 implementing the switch during on and off states of the switch S3. In FIG. 12, the first output resistance can be modeled by the driver resistance RDRV2, and the second output resistance by the on-resistance of the second switch S2 of the switch driver 44. In one embodiment, the driver resistance RDRV2 can be selected so that an impact frequency on the switch circuit 40 by the parasitic capacitances, having a value modeled by $1/(2\pi RDRV2\ (CDB+CSB+CBI))$, can have a value lower than the unity gain frequency of the operational amplifier A1. In a specific example, the value of the driver resistance RDRV2 can be selected to provide this impact frequency with a value less than half the unity gain frequency of the operational amplifier A1. In another specific example, the value of driver resistance RDRV2 can be selected to provide this impact frequency with a value less than one-tenth the unity gain frequency of the operational amplifier A1.

Figure 13A:
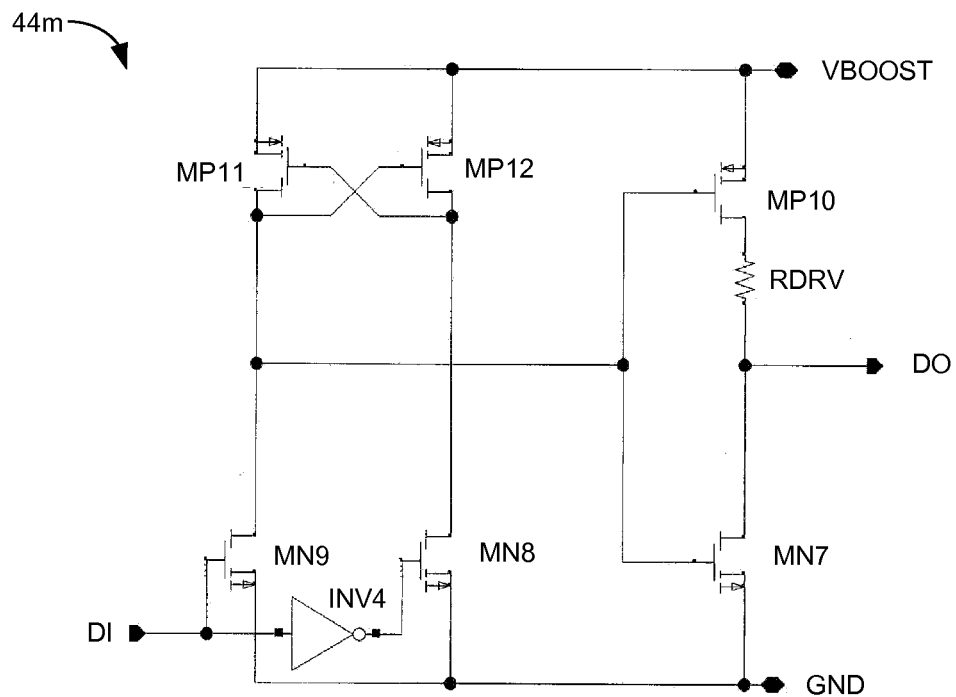
FIGS. 13A-13B are circuit schematics depicting embodiments of multi-output-resistance switch drivers that can drive the gate and the backgate, respectively, of a switch transistor.
Figure 13B:
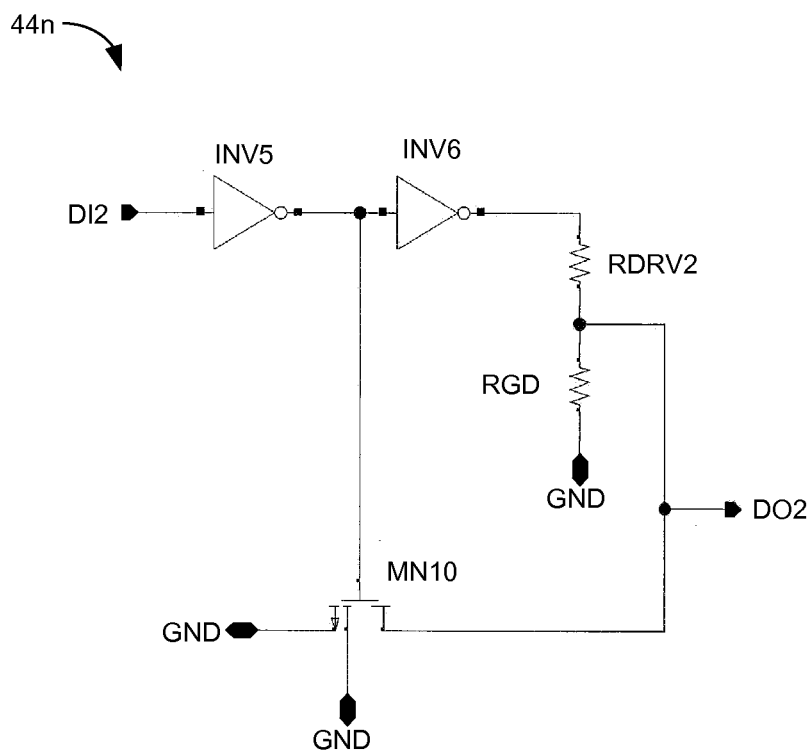

The first and second switches of the switch driver can be implemented by various other switch embodiments. In addition to the first and second switches S1, S2 being implemented by single common-source PMOS and NMOS transistors, e.g., as depicted in FIGS. 4 and 5, or by common-gate PMOS and NMOS transistors, e.g., as depicted in FIG. 8, or the first switch S1 being effectively implemented by the driver resistance RDRV, e.g., as depicted in FIG. 6, or by an off-connected PMOS transistor, e.g., as depicted in FIG. 7, other embodiments are possible. FIG. 13A depicts an embodiment 44m of the first switch driver 44k of FIG. 12, in which the first switch S1 is implemented by a common source PMOS transistor MP10, the second switch S2 a common source NMOS transistor MN7, and the driver resistance by an explicit driver resistance RDRV. The gates of the PMOS and NMOS transistors can be driven by circuitry including NMOS transistors MN8, MN9, PMOS transistors MP11, MP12, and inverter INV4, where NMOS transistor NM9 and inverter INV4 can receive the driver input DI. The embodiment of FIG. 13A can deliver a boosted driver output as a result of the use of a boosted first reference voltage VBOOST. FIG. 13B depicts an embodiment 44n of the second switch driver 44l of FIG. 12, in which the first switch S1 is implemented by a PMOS transistor (not shown) internal to an inverter INV6, the second switch S2 by a common-source NMOS transistor MN10 and the driver resistance by an explicit driver resistance RDRV2. The inverter INV6 and NMOS transistor MN10 can be driven by another inverter INV5, which can receive the driver input DI2.

Figure 14A:
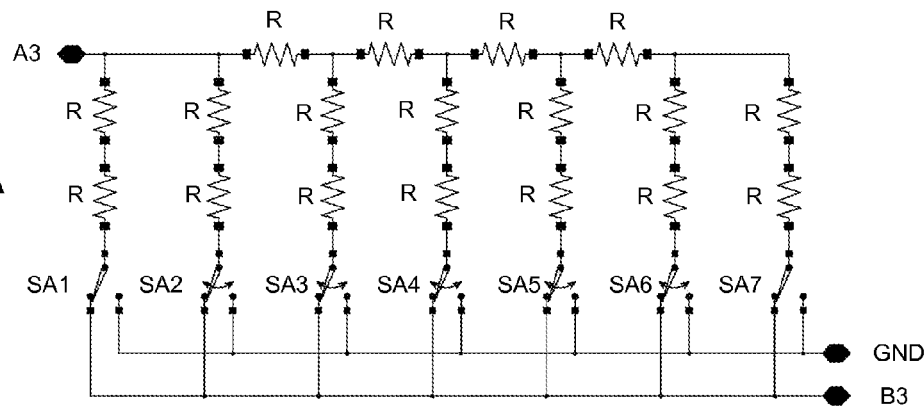
FIGS. 14A-14B are circuit schematics depicting additional embodiments of tunable impedances.
Figure 14B:
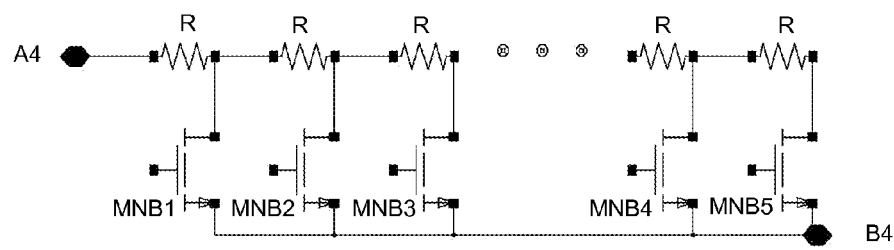

The multi-output-resistance switch driver 44 can be used to drive switches in any type of circuit. For example, the switch driver 44 can drive switches connected to summing nodes, e.g., to the inputs of operational amplifiers, in active-RC circuits, to reduce the performance degradation that may result from parasitic capacitances of transistors implementing the switches, as discussed variously above. The switch driver 44 can drive switches in other types of tunable structures in active-RC circuits in addition to the tunable structures depicted in FIGS. 2A and 2B. FIGS. 14A and 14B depict embodiments of other tunable resistance structures having switches that can be driven with embodiments of the switch driver. In FIG. 14A, a plurality of switch drivers 44 can drive a plurality of switches SA1-SA7 to tune an R-2R tunable resistor structure having a plurality of resistors R between two nodes A3, B3. In FIG. 14B, a plurality of switch drivers 44 can drive a plurality of switches MNB1-MNB to tune an tunable series resistor structure having a plurality of resistors R connected in series between two nodes A4, B4. The switch driver can also drive switches in any other type of tunable impedance structures in an active RC or other type of circuit.

Figure 14C:
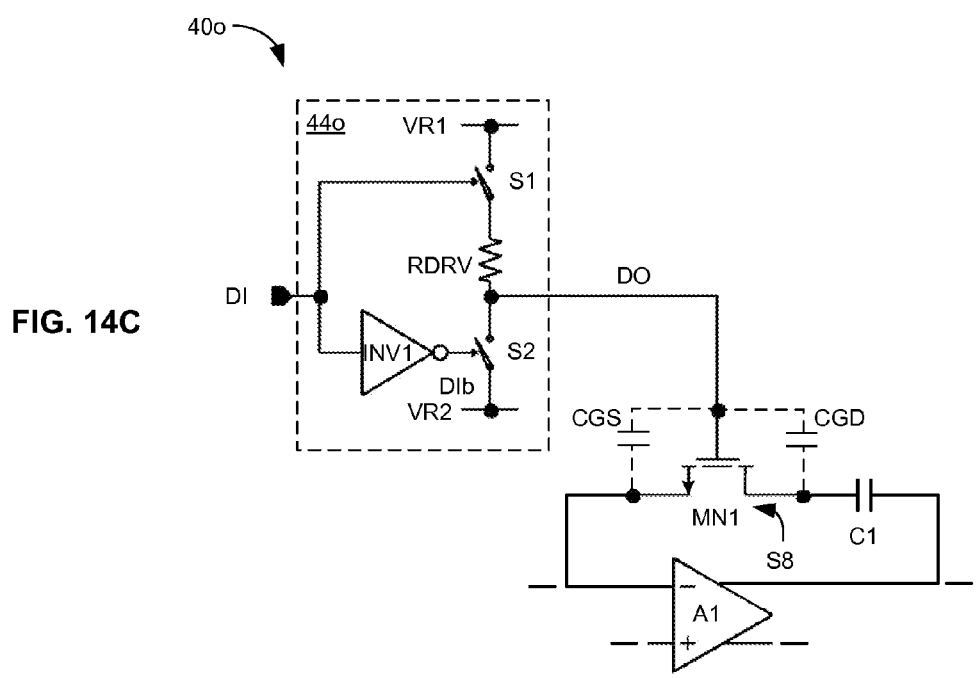
FIG. 14C is a circuit schematic depicting embodiments of the multi-output-resistance switch driver and the switch circuit.

As discussed above, the switch driver 44 can be used to drive switches selecting either resistors or capacitors. Embodiments of the switch circuit 40 can include one or more embodiments of the switch driver 44 driving one or more switches selecting one or more resistors, one or more capacitors, or any combination thereof. FIG. 14C depicts an embodiment of the switch circuit 40o including an embodiment of the switch driver 44o driving a switch S8 that can select a capacitor C1. Embodiments of the switch circuit 40 can also include one or more embodiments of the switch driver 44 driving one or more switches selecting one or more of any type of impedance, such as any combination of resistors, capacitors or inductors.

Figure 15A:
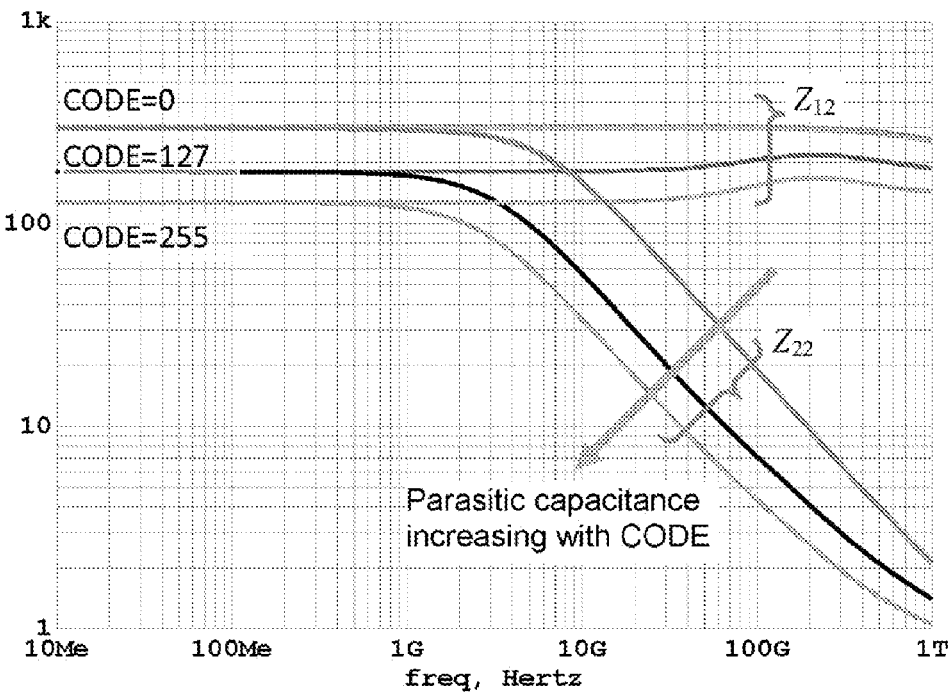
FIGS. 15A-15B are graphs depicting embodiments of simulation results for a traditional switch driver and an embodiment of the multi-output-resistance switch driver, respectively.
Figure 15B:
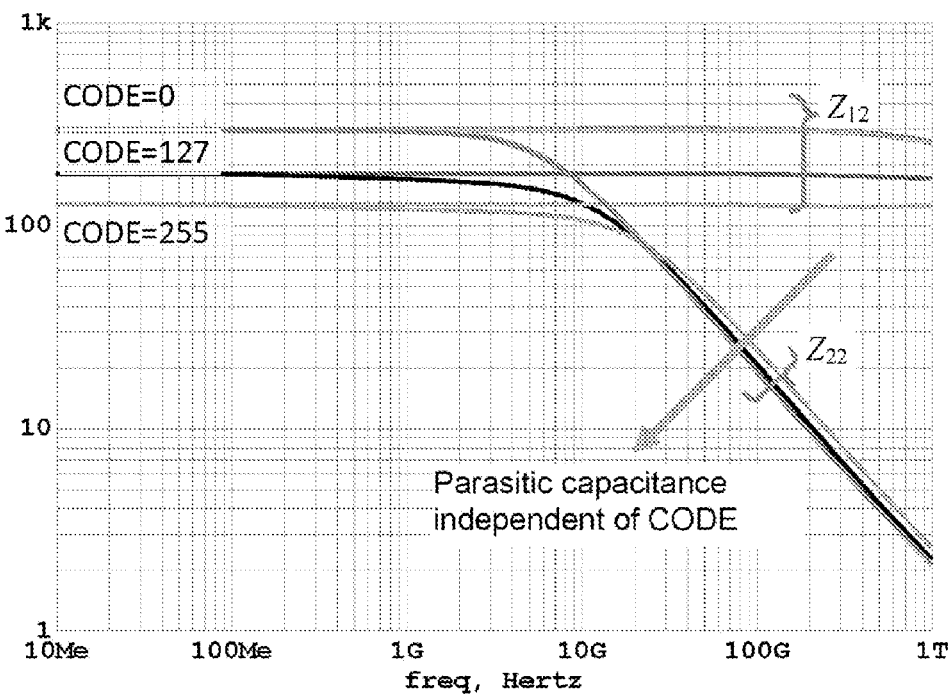

The removal or reduction of the impact of parasitic capacitances of the switch S3 through the use of the multi-output-resistance switch driver 44 was simulated for in 65 nm CMOS process for the switch driver embodiment of FIG. 8 and compared to a simple traditional balanced inverter switch driver. FIGS. 15A and 15B depict plots of two-port resistances Z12 and Z22, seen looking into the resistor R1 from the left in FIG. 3 and looking from the perspective of the output resistance Z1 indicated in FIG. 3, respectively. FIG. 15A depicts a simulation result using a traditional switch driver and FIG. 15B depicts a simulation result using an embodiment of the multi-output-resistance switch driver 44. Three digital control codes (0, 127, 255) were applied to the tunable resistance in the simulations. The vertical axis can represent resistance of the tunable resistance. A comparison of FIG. 15A and FIG. 15B can demonstrate the advantage of the multi-resistance switch driver 44. In the case of the traditional switch driver, shown in FIG. 15A, the resistance seen at the operational amplifier input terminal is $|Z22|=20\Omega$ at 100 GHz with CODE=0 but reduces to $|Z22|\approx 4\Omega$ with CODE=255 due to the channel capacitance of the switch S3. By contrast, in the case of the multi-output-resistance switch driver 44, depicted in FIG. 15B, $|Z22|\approx 20\Omega$ both for CODE=0 and 255. Thus, the parasitic channel capacitances can be effectively cancelled by the multi-output-resistance switch driver 44.

Figure 16A:
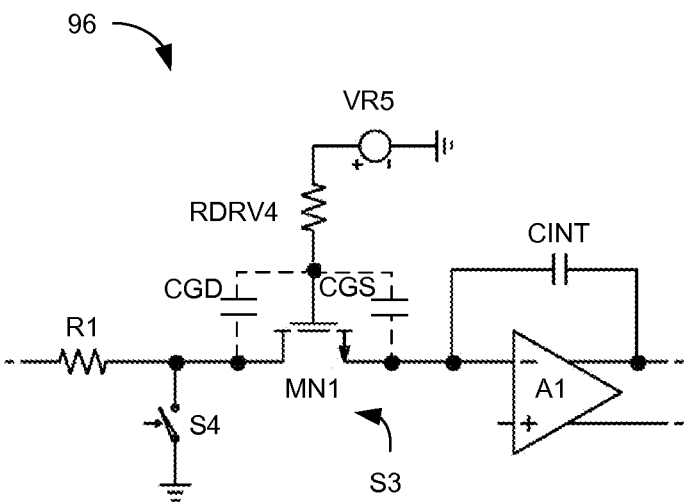
FIGS. 16A-16B are circuit schematics depicting embodiments of another switch driver of another switch circuit.
Figure 16B:
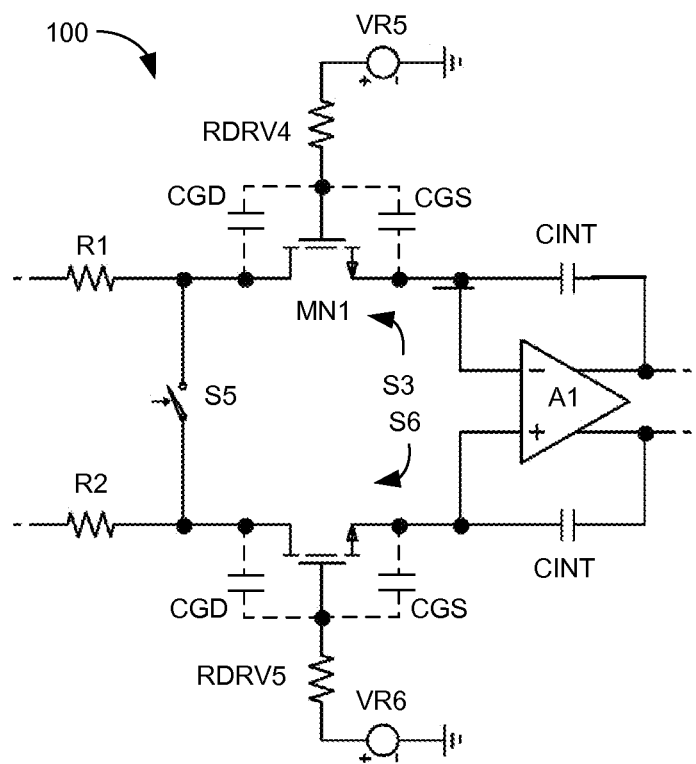

FIG. 16A depicts an embodiment of a switch circuit 96 having an embodiment of another alternative switch driver. In FIG. 16A, the switch S3 of the switch circuit 96 can be driven by a reference voltage VR5 through a driver resistance RDRV4 during both the on and off states of the switch S3. During the off state of the switch S3, a switch S4 can be turned on to prevent leakage current, and resulting circuit performance degradation, through switch S3. FIG. 16B depicts another embodiment of a switch circuit 100 having an embodiment of an alternative switch driver similar to that of FIG. 16A. In FIG. 16B, switches S3, S6 of the switch circuit 100 can be driven by references voltages VR5, VR6 through driver resistances RDRV4, RDRV5 during both the on and off states of the switch S3. During the off state of the switches S3, S6 a switch S5 can be turned on to prevent leakage current, and resulting circuit performance degradation, through switches S3, S6.

Figure 17:
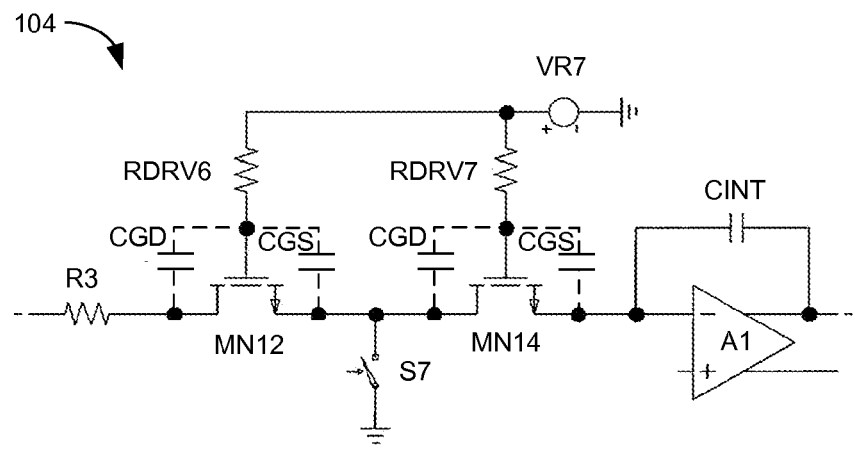
FIG. 17 is a circuit schematic depicting an embodiment of another switch driver of another switch circuit.

FIG. 17 depicts another embodiment of a switch circuit 104 having an embodiment of an alternative switch driver similar to that of FIGS. 16A and 16B. In FIG. 17, switch implementation transistors MN12, MN14 of the switch circuit 104 can be driven by a references voltage VR7 through driver resistances RDRV6, RDRV7 during both the on and off states of the switch transistors MN12, MN14. During the off state of the switch transistors MN12, MN14 a switch S7 can be turned on to prevent leakage current, and resulting circuit performance degradation, through switch transistors MN12, MN14.

Additional embodiments of the switch driver 44 and switch circuits 40, 96, 100, 104 are also possible. For example, any feature of any of the embodiments of the switch driver 44 and switch circuits 40, 96, 100, 104 described herein can optionally be used in or with any other embodiment of the switch driver 44 and switch circuits 40, 96, 100, 104. Embodiments of the switch driver 44 and switch circuits 40, 96, 100, 104 can also optionally include any subset of the components or features of any embodiments of the switch driver 44 and switch circuits 40, 96, 100, 104 described herein.

What is claimed is:

1. An amplifier circuit, comprising:
   an amplifier;
   a plurality of impedance selection transistors to electrically connect a plurality of impedances to an input of the amplifier in response to a plurality of driver output signals; and
   a plurality of switch drivers, each having an output to provide a respective one of the driver output signals to a respective one of the impedance selection transistors in response to a respective input signal, each switch driver including:
   a PMOS transistor connected to a resistor, the resistor connected to the switch driver output; and
   an NMOS transistor connected to the switch driver output,
   wherein a first output resistance of the switch driver when providing a first logic state of the driver output signal in response to a first logic state of the input signal is substantially equal to a resistance value of the resistor, a second output resistance of the switch driver when providing a second logic state of the driver output signal in response to a second logic state of the input signal is substantially equal to an on resistance of the NMOS transistor, and the first output resistance is greater than the second output resistance.

2. The amplifier circuit of claim 1, wherein a ratio of the first output resistance to the second output resistance greater than at least about 10:1.

3. The amplifier circuit of claim 1, wherein the resistor resistance value R is selected so that a frequency given by $1/(2\pi R (CGD+CGS))$ is less than one-fourth of a unity gain frequency of the amplifier, where CGD and CGS are gate-to-drain and gate-to-source parasitic capacitances of the respective impedance selection transistor.

4. The amplifier circuit of claim 1, wherein the second output resistance has a value selected to be less than one-hundredth of impedance magnitudes of gate-to-drain and gate-to-source parasitic capacitances of the respective impedance selection transistor at a unity gain frequency of the amplifier.

5. The amplifier circuit of claim 1, further comprising the plurality of impedances, wherein the plurality of impedances include at least one of: a resistor, or a capacitor.

6. The amplifier circuit of claim 1, wherein the PMOS transistor connects a first terminal of the resistor to a first reference voltage and the NMOS transistor connects a second terminal of the resistor to a second reference voltage.

7. The amplifier circuit of claim 1, wherein the impedance selection transistor has a gate to receive the driver output signal, a first pass-through terminal connected to the impedance, and a second pass-through terminal connected to the input of the amplifier, wherein the first and second pass-through terminals include the source and drain of the transistor.

8. The amplifier circuit of claim 1, wherein the PMOS transistor is arranged in a common-gate configuration with a drain connected to a first terminal of the resistor, and the NMOS transistor is arranged in a common-gate configuration with a drain connected to a second terminal of the resistor.

9. The amplifier circuit of claim 1, wherein a ratio of the first output resistance to the second output resistance is greater than at least about 4:1.

10. The amplifier circuit of claim 8, wherein the switch driver circuit is configured to receive the respective input signal through the source of the NMOS transistor.

11. The amplifier circuit of claim 8, wherein the switch driver circuit is configured to receive a boosted voltage through a source of the PMOS transistor.

12. The amplifier circuit of claim 8, wherein the switch driver circuit is configured to receive an upper supply voltage at gates of the PMOS and NMOS transistors.

13. An impedance control circuit, comprising:
    an impedance selection switch to electrically connect and disconnect an impedance to an input of an amplifier, the impedance selection switch including a transistor having a gate and a backgate, the gate receiving a first driver output signal and the backgate receiving a second driver output signal;
    a pair of switch drivers, each switch driver having an output to provide an output signal as a respective one of the first or second driver output signals in response to a respective input signal, each switch driver including:
    a first transistor and a resistor; and
    a second transistor,
    wherein a first output resistance of the switch driver during a first logic state of the output signal in response to a first logic state of the input signal is substantially equal to a resistance of the resistor, a second output resistance of the switch driver during a second logic state of the output signal in response to a second logic state of the input signal is substantially equal to an on resistance of the second transistor, and the first output resistance is greater than the second output resistance.

14. An impedance control circuit, comprising:
    an impedance selection switch to electrically connect and disconnect an impedance to an input of an amplifier in response to a driver output signal;
    a switch driver to provide the driver output signal, the switch driver including:
    a first transistor and a resistor; and
    a second transistor; and
    a second switch driver to provide a second driver output signal to a backgate of a transistor of the impedance selection switch, the second switch driver including:
    a third transistor and a second resistor; and
    a fourth transistor.

15. The impedance control circuit of claim 14, wherein the switch driver includes the first transistor and the resistor.

16. The impedance control circuit of claim 14, wherein a ratio of a first output resistance of the switch driver in response to a first logic state of the input signal to a second output resistance of the switch driver in response to a second logic state of the input signal is greater than at least about 4:1.

17. The impedance control circuit of claim 16, wherein the ratio of the first output resistance to the second output resistance is greater than at least about 10:1.

18. The impedance control circuit of claim 16, wherein the first output resistance has a value ROUT1 selected so that a frequency given by $1/(2\pi ROUT1 (CGD+CGS))$ is less than one-fourth of a unity gain frequency of the amplifier, where CGD and CGS are gate-to-drain and gate-to-source parasitic capacitances of a switch transistor of the impedance selection switch.

19. The impedance control circuit of claim 16, wherein the second output resistance has a value selected to be less than one-hundredth of impedance magnitudes of gate-to-drain and gate-to-source parasitic capacitances of a switch transistor of the impedance selection switch at the unity gain frequency of the amplifier.

20. The impedance control circuit of claim 14, wherein the switch driver includes the first transistor and the resistor, the first transistor connects a first terminal of the resistor to a first reference voltage, and the second transistor connects a second terminal of the resistor to a second reference voltage.

21. The impedance control circuit of claim 20, wherein a circuit node connecting the resistor to the second transistor provides the driver output signal to the impedance selection switch.

22. The impedance control circuit of claim 14, wherein a third output resistance of the second switch driver when the driver output signal turns on the switch is greater than a fourth output resistance of the second switch driver when the driver output signal turns off the switch.

23. The impedance control circuit of claim 14, wherein the amplifier is part of an active-RC filter.

* * * * *